United States Patent

Murayama

(10) Patent No.: US 9,419,037 B2
(45) Date of Patent: Aug. 16, 2016

(54) IMAGING APPARATUS

(71) Applicant: Olympus Corporation, Tokyo (JP)

(72) Inventor: Kazuaki Murayama, Tokyo (JP)

(73) Assignee: Olympus Corporation, Tokyo (JP)

(*) Notice: Subject to any disclaimer, the term of this patent is extended or adjusted under 35 U.S.C. 154(b) by 0 days.

(21) Appl. No.: 15/058,856

(22) Filed: Mar. 2, 2016

(65) Prior Publication Data

US 2016/0181300 A1    Jun. 23, 2016

Related U.S. Application Data

(60) Division of application No. 14/918,973, filed on Oct. 21, 2015, now Pat. No. 9,305,957, which is a division of application No. 14/534,742, filed on Nov. 6, 2014, now Pat. No. 9,190,436, which is a continuation of application No. PCT/JP2013/006242, filed on Oct. 22, 2013.

(30) Foreign Application Priority Data

Nov. 8, 2012  (JP) .................................. 2012-246651

(51) Int. Cl.
  *H01L 31/0232* (2014.01)
  *H01L 27/146* (2006.01)

(52) U.S. Cl.
  CPC .... *H01L 27/14627* (2013.01); *H01L 27/14605* (2013.01)

(58) Field of Classification Search
  CPC .................... H01L 27/1463; H01L 27/14603; H01L 27/14609; H01L 27/14621; H01L 27/14623; H01L 27/14625; H01L 27/14627; H01L 27/14643; H01L 27/14645; H01L 27/14667; H01L 27/14812
  USPC ................... 257/98, 294, 431, 432, 436, 443, 257/E33.068, E33.073, E31.095, E31.097, 257/E31.128, E21.527, E21.53
  See application file for complete search history.

(56) References Cited

U.S. PATENT DOCUMENTS

| | | | | |
|---|---|---|---|---|
| 7,812,299 B2* | 10/2010 | Kusaka | ..................... | G01C 3/08 250/208.1 |
| 8,749,620 B1 | 6/2014 | Knight et al. | | |
| 2011/0122388 A1 | 5/2011 | Deguenther | | |
| 2013/0083225 A1 | 4/2013 | Minowa et al. | | |
| 2013/0087875 A1 | 4/2013 | Kobayashi et al. | | |
| 2013/0140663 A1* | 6/2013 | Fukuda | ................... | G03B 13/36 257/432 |
| 2014/0368690 A1 | 12/2014 | Fukuda et al. | | |

FOREIGN PATENT DOCUMENTS

| | | |
|---|---|---|
| JP | 2003-523646 A | 8/2003 |
| JP | 2008-015215 A | 1/2008 |
| JP | 2010-102230 A | 5/2010 |
| JP | 2011-515045 A | 5/2011 |

OTHER PUBLICATIONS

International Search Report dated Jan. 21, 2014, issued in counterpart application No. PCT/JP2013/006242.
Written Opinion dated Jan. 21, 2014, issued in counterpart application No. PCT/JP2013/006242.

* cited by examiner

*Primary Examiner* — Mohammad Islam
*Assistant Examiner* — Joannie A Garcia
(74) *Attorney, Agent, or Firm* — Westerman, Hattori, Daniels & Adrian, LLP

(57) ABSTRACT

Provided is an imaging apparatus having a plurality of light receiving parts for each one microlens in order for capturing a three-dimensional image, while being capable of obtaining a more natural image when creating a two-dimensional image. The imaging apparatus includes: a microlens array (2) having a plurality of microlenses (20) regularly aligned two-dimensionally; an imaging lens for imaging light from a subject onto the microlens array (2); and a plurality of light receiving parts (22L, 22R) disposed for each of the plurality of microlenses (20). The plurality of light receiving parts (22L, 22R) associated with each microlens (20) receive the light from the subject that has been imaged onto the microlens and subject the light to photoelectric conversion. The imaging lens has a pupil which is disposed as being out of conjugation with a light receiving plane of the light receiving parts (22L, 22R).

13 Claims, 12 Drawing Sheets

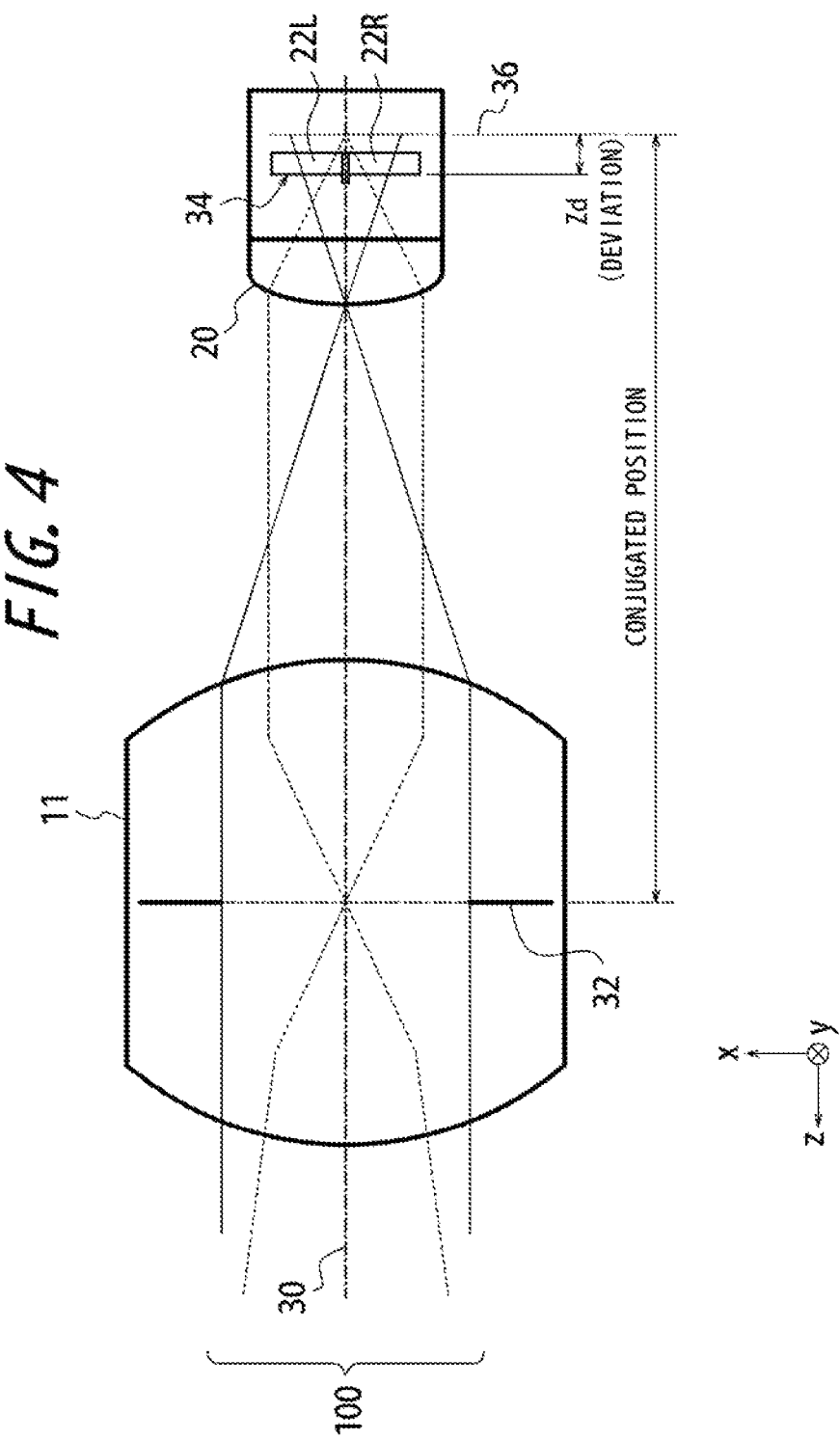

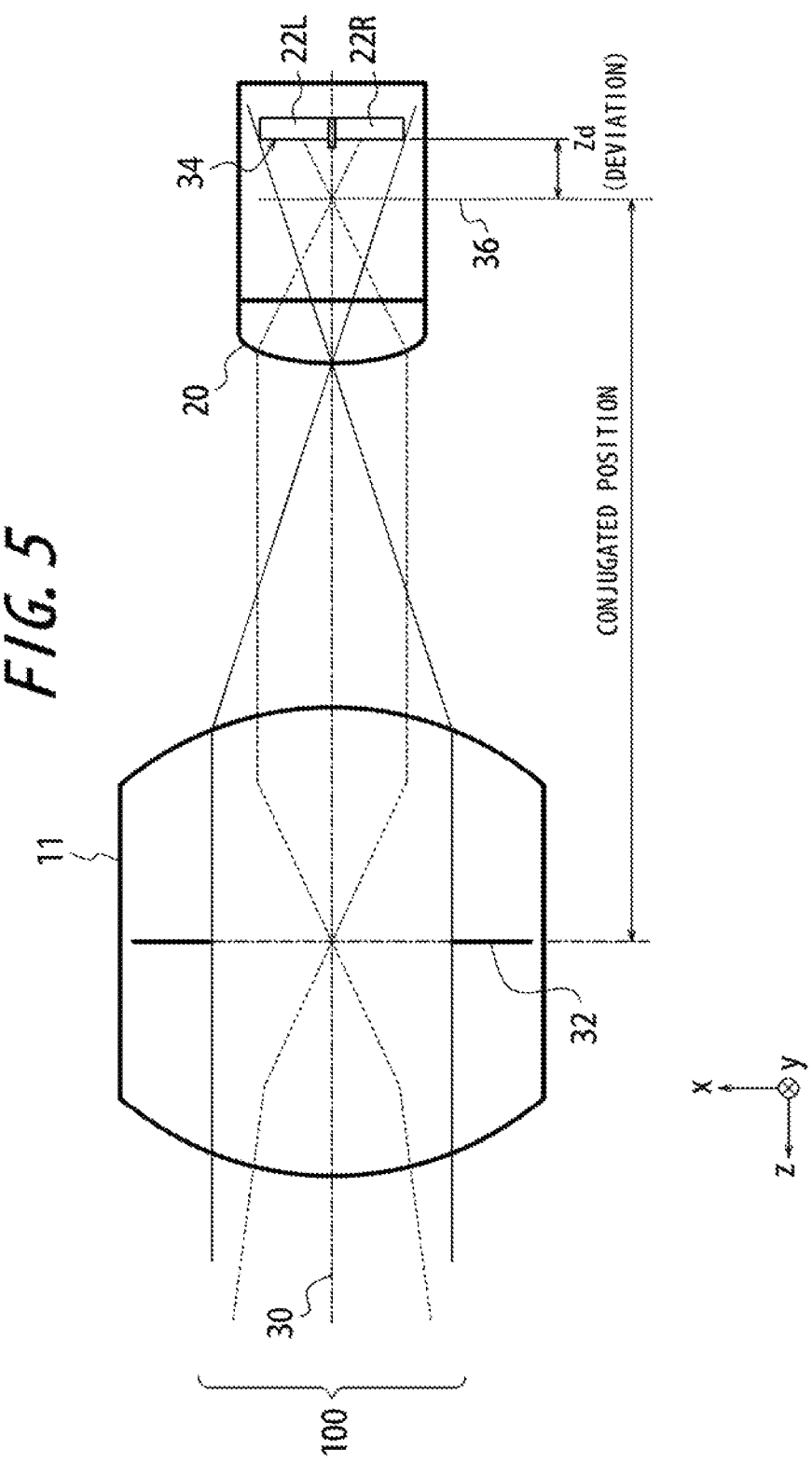

IMAGING APPARATUS

CROSS REFERENCE TO RELATED APPLICATIONS

The present application is a divisional of U.S. application Ser. No. 14/918,973, filed on Oct. 21, 2015, which is a divisional of Ser. No. 14/534,742 filed on Nov. 6, 2014, which is a Continuing Application based on International Application PCT/JP2013/006242 filed on Oct. 22, 2013, which, in turn, claims the priority from Japanese Patent Application No. 2012-246651 filed on Nov. 8, 2012, the entire disclosure of these earlier applications being herein incorporated by reference in their entirety.

TECHNICAL FIELD

The present invention relates to an imaging apparatus for acquiring image information including parallax information by dividing a pupil of an optical system.

BACKGROUND ART

There has been known an imaging apparatus including a plurality of microlenses regularly aligned two-dimensionally and an image sensor having a plurality of light receiving parts disposed for each of the microlenses, the microlenses and the image sensor being used such that a pupil of light to be imaged by the microlenses is divided by an imaging lens so that the light is received by different light receiving parts for each different division of the pupil, to thereby obtain parallax information. For example, according to Cited Documents 1 and 2, micro cylindrical lenses are two-dimensionally aligned, and light receiving elements are symmetrically disposed under the micro cylindrical lenses along a center line extending in the vertical direction of each of the cylindrical lenses, to thereby detect, by each of the light receiving parts, signals of pixels (right pixels) in the right view field and signals of pixels (left pixels) in the left view field.

CITATION LIST

Patent Literature

PTL 1: JP 2011-515045 A
PTL 2: JP 2003-523646 A

SUMMARY OF INVENTION

The signals thus output from the aforementioned imaging apparatus may be used to generate an image of the right view field and an image of the left view field (parallax images), and the parallax images may be displayed as a stereoscopic image using a dedicated monitor. Further, the pixel signals of the right view field and the pixel signals of the left view field may be added so as to display the parallax images as a two-dimensional image as well. As described above, in an imaging apparatus having an image sensor and an imaging lens, the image sensor having a plurality of light receiving parts combined with one microlens, the pupil of the imaging lens is positioned in conjugate with the light receiving plane of the light receiving parts, so that the image of the right view field and the image of the left view field are more clearly separated on the light receiving plane of the light receiving parts.

However, the right pixels and the left pixels have a dead zone therebetween where no ordinary light is detected, which means that no light can be detected in a region centering around the optical axis direction (0-degree direction) of the microlens. The light receiving plane of the light receiving parts is conjugate to the pupil plane of the imaging lens, and this is equivalent to having a region to shield light extending in the vertical direction near the optical axis.

Therefore, the light receiving element cannot detect light from the background which is incident on the imaging lens at an incident angle close to the optical axis direction. Accordingly, in generating a two-dimensional image by adding the pixel signals of the right view field and the pixel signals of the left view field, the image partially suffers decrease in light amount and missing of information, hence background blur or the like cannot be neatly achieved, having double lines generated thereon.

An imaging apparatus according to the present invention includes:

a microlens array having a plurality of microlenses regularly aligned two-dimensionally;

an imaging lens for imaging light from a subject onto the microlens array; and a plurality of light receiving parts disposed for each of the plurality of microlenses, the plurality of light receiving parts being associated with each microlens, the plurality of light receiving parts including at least two light receiving parts for receiving the light from the subject that has been imaged onto the microlenses, and subjecting the light to photoelectric conversion;

in which the imaging lens has a pupil disposed as being out of conjugation with a light receiving plane of each of the light receiving parts.

It is preferred that the following relation is established:

$$0.02 < \left| \frac{Z_d}{f_L} - \frac{S}{P} \right| < 0.1 (Z_d \neq 0),$$

where $f_L$ represents the focal length of the microlens, p represents the pitch of the microlenses, S represents the width of a dead zone lying between the light receiving parts associated with the same microlens, and $Z_d$ represents a deviation between the light receiving plane of the light receiving parts and the conjugated position of the pupil of the imaging lens.

According to an embodiment of the present invention, the light receiving parts are disposed, for each of the microlenses, by two each in the horizontal direction of an image of the subject.

According to another embodiment of the present invention, the microlens may be a cylindrical lens.

According to further another embodiment, the plurality of light receiving parts associated with each of the microlenses include: each two light receiving parts disposed in the horizontal direction of the image of the subject; and each two light receiving parts disposed in the perpendicular direction of the image of the subject.

According to still further embodiment, the light receiving parts are disposed by two rows each in the horizontal direction and in the perpendicular direction, respectively, of the image of the subject, as being associated with each of the microlenses.

Moreover, the imaging apparatus may generate, based on pixel signals obtained from the plurality of light receiving elements each disposed in the horizontal direction and in the perpendicular direction, parallax images in the horizontal direction and in the perpendicular direction, and may generate a three-dimensional image, based on the parallax images.

BRIEF DESCRIPTION OF DRAWINGS

The present invention will be further described below with reference to the accompanying drawings, wherein:

FIG. 4 is a view for illustrating an arrangement of an imaging lens, a microlens, and a light receiving part;

FIG. 5 is a view for illustrating an arrangement of an imaging lens, a microlens, and a light receiving part;

DESCRIPTION OF EMBODIMENTS

In the following, embodiments of the present invention are described with reference to the accompanying drawings.

First Embodiment

Figure 1:
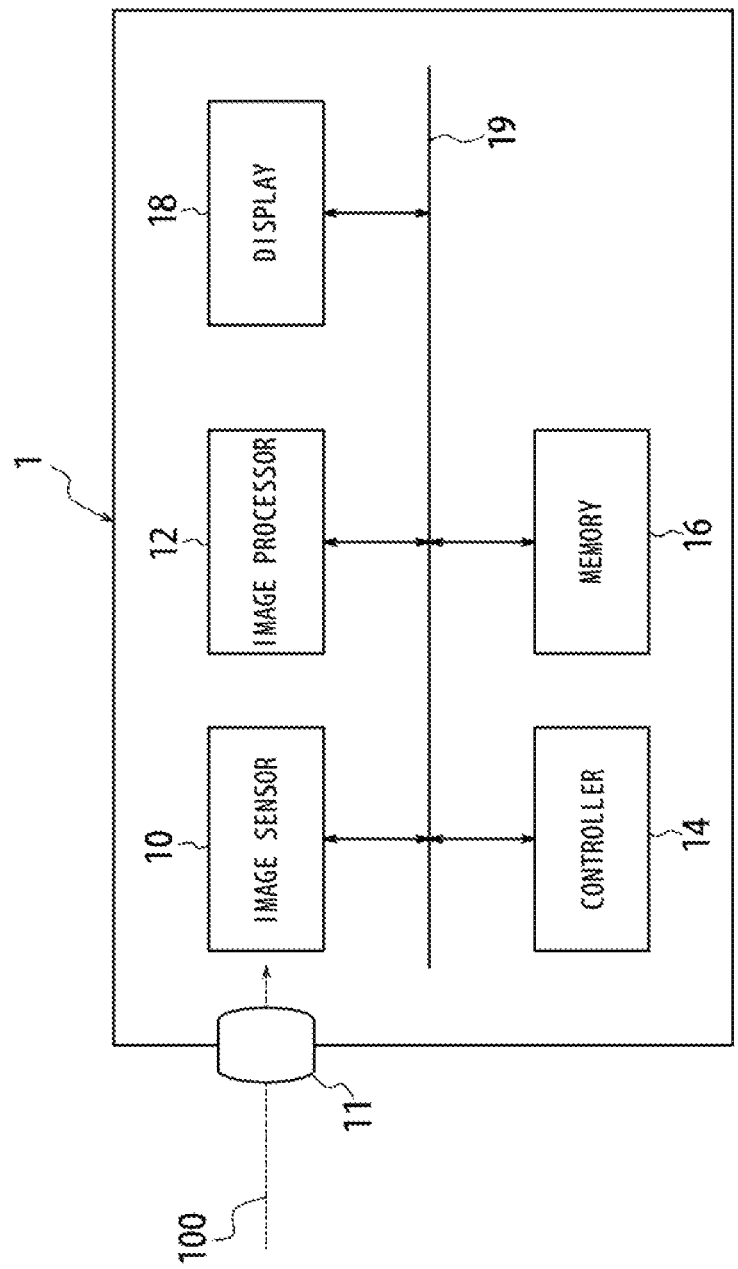
FIG. 1 is a block diagram illustrating a schematic configuration of an imaging apparatus according to a first embodiment of the present invention.

FIG. 1 is a block diagram illustrating a schematic configuration of an imaging apparatus according to a first embodiment of the present invention. The imaging apparatus 1 captures parallax images for use in displaying a stereoscopically captured image, based on a subject light 100 from a subject. The imaging apparatus 1 includes: an imaging lens 11; an image sensor 10; an image processor 12; a controller 14; a memory 16; and a display 18. The image sensor 10, the image processor 12, the controller 14, the memory 16, and the display 18 are connected to a bus 19, and configured to be capable of transmitting various signals to one another.

Upon incidence of the subject light 100 thorough the imaging lens 11, the image sensor 10 captures an image taken in the left visual field and an image taken in the right visual field having parallax therebetween, based on the subject light 100, and outputs pixel signals constituting each of the captured images. The captured images each include two-dimensionally-aligned pixels. The number of pixels constituting a one-frame of the captured image may be, for example, in a range of 640×480 pixels to 4000×3000 pixels, but not limited thereto. The image sensor 10 may be CMOS (Complementary Metal Oxide Semiconductor) or CCD (Charge Coupled Device), each having light receiving elements arranged as being associated with the pixels, and generates pixel signals by the light receiving elements and outputs the signals. The pixel signals are generated and output for each one frame, for example. The pixel signals may be indicative of gradation values of colors including, for example, R (Red), G (Green), and B (Blue) for each pixel. The pixel signal may be a digital signal obtained by subjecting an output signal from the light receiving element to A/D conversion.

The image processor 12 performs, on the captured image data including pixel signals for each one frame, predetermined image processing such as color luminance correction and distortion correction, and data compression and decompression. The image processor 12 may be a processor such as, for example, a DSP (Digital Signal Processor) or ASIC (Application Specific Integrated Circuit).

The memory 16 is a frame memory for storing data on captured images before and/or after being subjected to image processing. The memory 16 may be, for example, SRAM (Static Random Access Memory) or DRAM (Dynamic RAM). Alternatively, the memory 16 may include a data reading/writing device to various storage media including a hard disk and a portable flash memory.

The display 18 displays a stereoscopically captured image, based on data on images captured in the left view field and in the right view field. The display 18 may include, for example, LCD (Liquid Crystal Display) having a polarization filter corresponding to the parallax between the right and left eyes, and a control circuit thereof. The display 18 displays data on right and left captured images having parallax therebetween, to thereby display a stereoscopically captured image for allowing the user to have a stereoscopic perception of the image.

The controller 14 sends control signals to the image sensor 10, the image processor 12, the memory 16, and the display 18, to thereby control the operation of the imaging apparatus 1 in an integral manner. The controller 14 may be, for example, a microcomputer.

Figure 2:
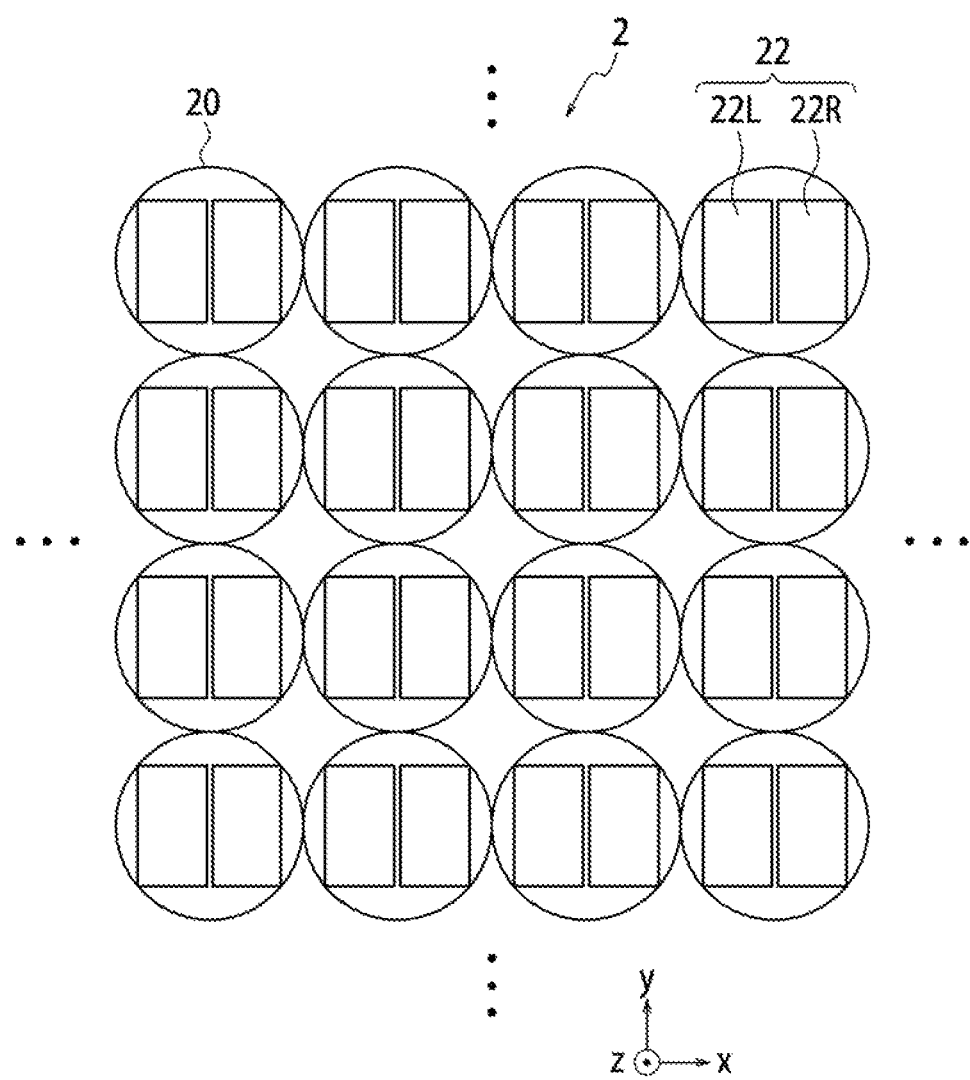
FIG. 2 is a diagram for illustrating a configuration of a main part of an image sensor.

FIG. 2 is a diagram for illustrating a configuration of a main part of the image sensor 10.

As illustrated in FIG. 2, the image sensor 10 has a microlens array 2 including two-dimensionally aligned spherical microlenses 20. The microlenses 20 are each disposed as being associated with one pixel of each of the images in the right view field and the left view field which are to be captured as parallax images. In the drawing, the X-axis direction corresponds to the lateral direction of the captured image while the Y-axis direction corresponds to the perpendicular direction of the captured image. In addition, the Z-axis direction corresponds to the optical axis direction.

The image sensor 10 also includes, for each one of the microlenses 20, two light receiving parts in a pair 22. The pair 22 includes light receiving parts 22L, 22R, which are, for example, photodiodes included in CMOS or CCD. The light receiving parts 22L, 22R each comprise a left light receiving element 22L and a right light receiving element 22R, respectively, where the left light receiving element 22L generates and outputs signals of pixels (left pixels) constituting the image captured in the left view field and the right light receiving element 22R generates and outputs signals of pixels (right pixels) constituting the image captured in the right view field. The light receiving parts 22L, 22R are disposed as being adjacent to each other in the X-axis direction, that is, in the lateral direction. The light receiving parts 22L, 22R are associated with the pixels of each of the captured images in a pair for displaying a stereoscopically captured image.

Figure 3:
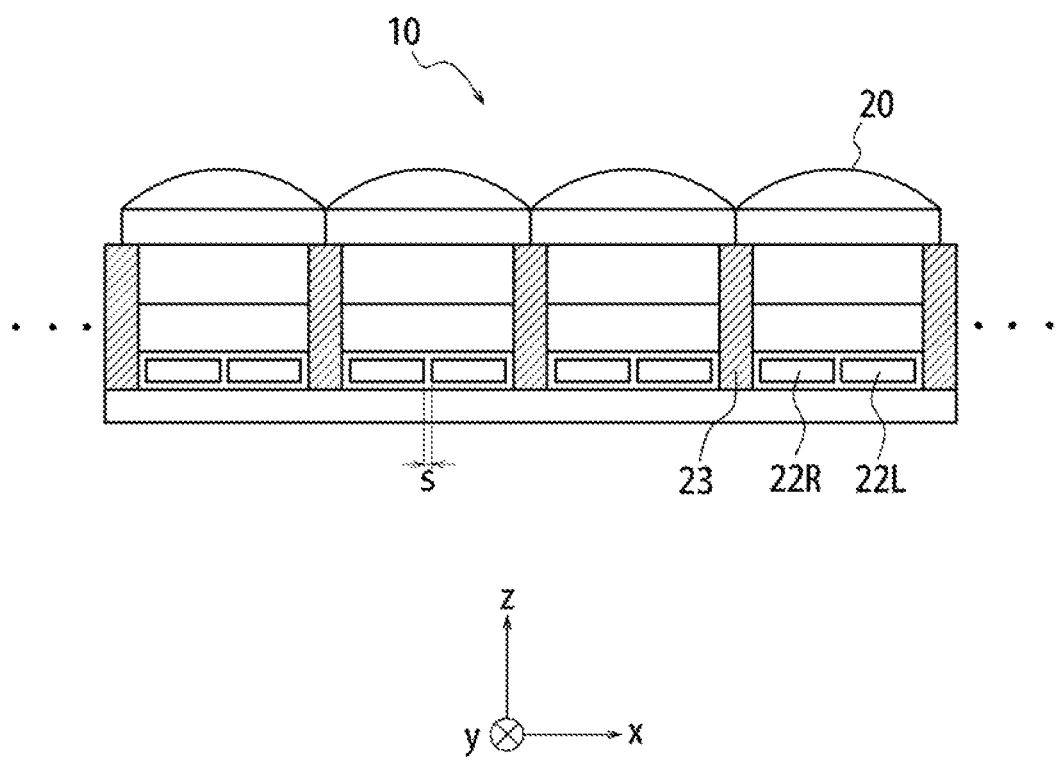
FIG. 3 is a sectional view in the horizontal direction of the image sensor.

FIG. 3 is a sectional view of the image sensor taken along the XZ plane (horizontal section). As illustrated in FIG. 3, the microlenses 20 are each formed as an on-chip lens disposed on the foreside of the pair of the left and right light receiving parts 22L and 22R. Further, disposed between a pair of light receiving parts 22L, 22R associated with one microlens 20 and another pair of light-receiving parts 22L, 22R associated with another microlens 20 is a wiring layer 23 for driving and controlling the respective light receiving parts 22L, 22R or for transmitting signals therebetween. The wiring layer 23 may be formed of metal such as, for example, copper or aluminum, and merely reflects or scatters light without allowing the transmission thereof, to thereby function as a light shielding layer. Further, the two light receiving parts 22L and 22R associated with one microlens 20 have a dead zone therebetween with a width S.

FIG. 4 is a view for illustrating an arrangement of the imaging lens, the microlens of the image sensor, and the light receiving part. The imaging lens 11 is formed of one lens or of a combination of a plurality of lenses, and has an aperture 32. The imaging lens 11 has an optical axis 30 arranged parallel to the optical axis of each microlens 20. The light receiving elements 22L and 22R have a light receiving plane 34 disposed in the vicinity of a rear focal point which is deviated by a predetermined distance from the rear focal point of the microlens 20. Most of the imaging lenses for use in digital cameras in recent years are each designed to have an exit pupil positioned in the vicinity of a point at infinity. Therefore, the image at the exit pupil of the imaging lens is formed, through the microlens 20, on a pupil conjugate plane 36 in the vicinity of the light receiving plane 34 of the light receiving parts 22L, 22R.

Referring to FIG. 4, the light receiving plane 34 of the light receiving part 22L, 22R is positioned to have a shorter distance to the object side, than does the pupil conjugate plane 36 that is on the image side and positioned in conjugate with the pupil of the imaging lens 11. FIG. 5 is a view for illustrating another arrangement of the imaging lens, the microlens, and the light receiving part. Referring to FIG. 5, the light receiving plane 34 of the light receiving parts 22L, 22R is positioned to have a shorter distance to the image side, than does the pupil conjugate plane 36 that is on the image side and positioned in conjugate with the pupil of the imaging lens 11.

In either one of the arrangements illustrated in FIGS. 4 and 5, the subject light 100 is stopped by the aperture 32 and condensed on the microlens array 20, so as to be detected by the light receiving parts 22L, 22R via a color filter of R, G, B (not shown) disposed between the microlens 20 and the light receiving parts 22L, 22R. The light receiving parts 22L, 22R receive incident light of either one of the colors of R, G, B, whereby having a subject image formed thereon.

Light that has passed mainly on the left region of the pupil (left light flux) is incident on the left light receiving part 22L to generate left pixel signals constituting an image captured in the left view field. Meanwhile, light that has passed mainly on the right region of the pupil (right light flux) is incident on the right light receiving part 22R to generate right pixel signals constituting an image captured in the right view field. However, the pupil of the imaging lens 11 and the light receiving plane 34 of the light receiving parts 22L, 22R are out of conjugation with each other, which generates crosstalk between the subject lights 100 each incident on the light receiving part 22L for the left eye and on the light receiving part 22R for the right eye, respectively.

Figure 6A:
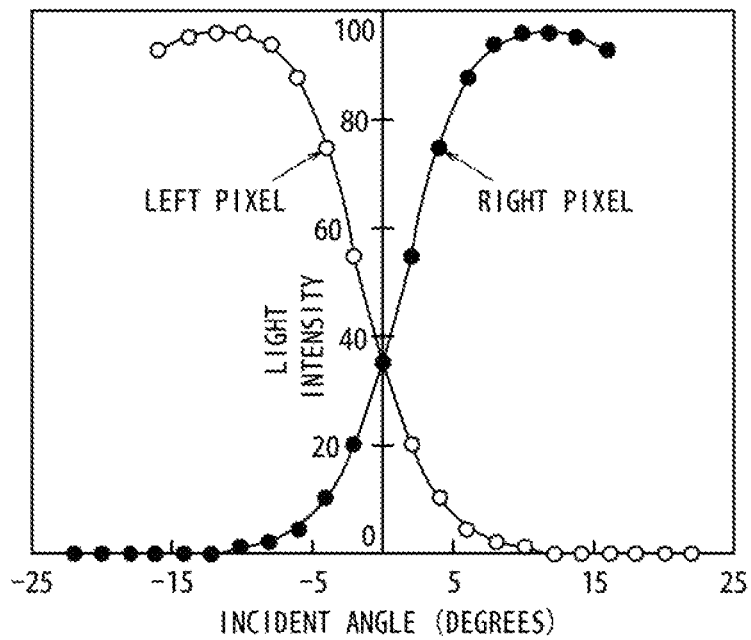
FIG. 6A is a graph showing a relation between the incident angle onto the light receiving part and the signal light intensity, according to the first embodiment.
Figure 6B:
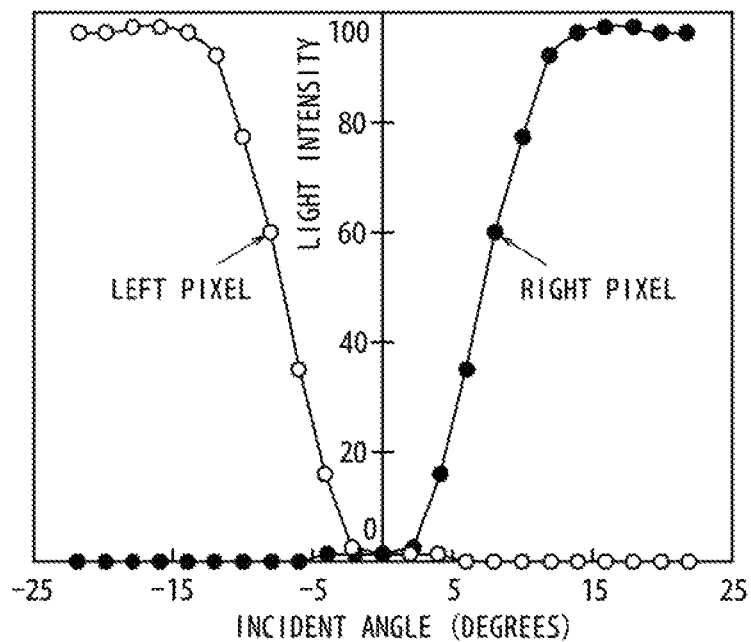
FIG. 6B is a graph showing a relation between the incident angle onto the light receiving part and the signal light intensity, with a pupil plane of the imaging lens and a light receiving plane of the light receiving part being conjugate to each other.

FIGS. 6A, 6B each are a graph showing a relation between the incident angle of the subject light onto the image sensor and the signal light intensities of the left pixel signal and of the right signal pixel, in which FIG. 6A shows a case according to the first embodiment and FIG. 6B shows a case where the pupil plane of the imaging lens and the light receiving plane of the light receiving elements are conjugate to each other. According to the first embodiment, as shown in FIG. 6A, due to the crosstalk occurring between the left light receiving part 22L and the right light receiving part 22R, light of a certain intensity is detected in the light receiving elements 22L, 22R even at the incident angle of 0 degrees. In contrast thereto, when the pupil plane of the imaging lens 11 is conjugate to the light receiving plane of the light receiving parts 22L, 22R, substantially no light is detected in either one of the left light receiving part 22L and the right light receiving part 22R at an incident angle in a certain range around 0 degrees, as shown in FIG. 6B, despite that the left light receiving part 22L and the right light receiving part 22R are separated from each other. As shown in FIG. 6A, when the pupil of the imaging lens 11 and the light receiving plane 34 of the light receiving parts 22L, 22R are out of conjugation with each other, signals from the left pixels and signals from the right pixel are different from each other in view field, and thus the signals can be applicable for acquiring three-dimensional image information. Further, in creating a two-dimensional image by adding left pixel signals and right pixel signals associated with each microlens 20, the image can be obtained as a natural image with no double lines appearing thereon.

Figure 7:
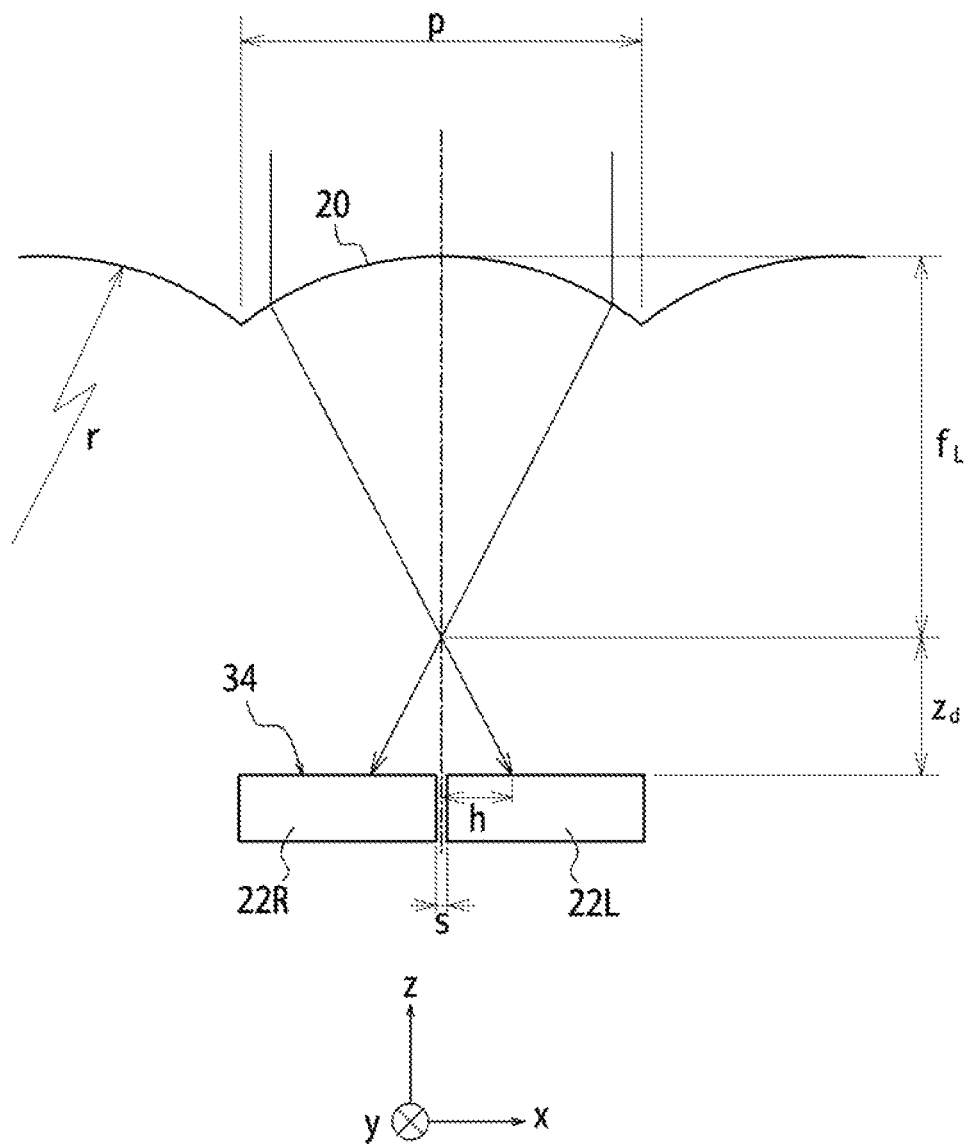
FIG. 7 is a diagram for illustrating parameters of the image sensor.

Next, referring to FIG. 7, description is given of conditions necessary for acquiring parallax images for generating a three-dimensional image using the left light receiving part 22L and the right light receiving part 22R, and for generating, by adding those output signals, a two-dimensional image as a natural image.

First, the microlens 20 has a focal length $f_L$ represented as follows:

[Expression 1]

$$f_L = \frac{r}{n_{av} - 1}, \tag{1}$$

where r represents the curvature radius of the microlens 20, and $n_{av}$ represents an average refractive index of a medium through which light is carried from the microlens 20 to the light receiving plane 34 of the light receiving parts 22L, 22R.

The left light receiving part 22L receives, in addition to a major portion of the left light flux, part of the right light flux, while the right light receiving part 22R receives, in addition to a major portion of the right light flux, part of the right light flux. The part of the light flux being incident on the opposite one of the left and right light receiving parts 22L, 22R may desirably be in a range of 2% to 10% of the total amount of the said light flux. In other words, a blurring width sb on the light receiving plane 34 of the light receiving parts 22L, 22R may desirably be in a following range:

$$0.02p < sb < 0.1p \tag{2},$$

where p represents the pitch of the microlenses 20.

Further, when the left and right light receiving parts 22L, 22R has a dead zone therebetween, the blurring width sb on the light receiving plane 34 may desirably be in a following range:

$$0.02p + S < sb < 0.1p + S \tag{3},$$

where S represents the width of the dead zone.

Condition satisfying the expression (3) are discussed in below.

First, as illustrated in FIG. 7, one of the light receiving parts 22L, 22R is defined to have a blurring width of h that satisfies the following equation:

$$sb = 2h \quad (4).$$

Then, the expression (3) may be substituted into the equation (4) to be obtained as follows:

$$0.02p + S < 2h < 0.1p + S \quad (5).$$

Here, as described above, the focal point of the microlens 20 is deviated from the light receiving plane 34 by a deviation of $z_d$. Referring to FIG. 7, the blurring width h and the deviation $z_d$ have a relation represented as follows:

[Expression 2]

$$f_L h = \frac{p}{2} z_d, \quad (6)$$

which may be transformed as:

[Expression 3]

$$h = \frac{p z_d}{2 f_L}. \quad (7)$$

Further, the equation (7) may be substituted into the expression (5), which may be transformed as follows:

[Expression 4]

$$0.02 < \frac{z_d}{f_L} - \frac{S}{p} < 0.1. \quad (8)$$

The focus deviation on the rear side shown in FIG. 4 and the focus deviation on the front side as shown in FIG. 5 are symmetric, and thus the value can be regarded as an absolute value as follows:

$$0.02 < \left| \frac{z_d}{f_L} - \frac{S}{p} \right| < 0.1 \ (z_d \neq 0), \quad (9)$$

which shows a condition desirable.

Here, the part of the light flux being incident on the opposite one of the left and right receiving parts 22L, 22R is desirably defined to be in a range of 2% to 10% of the total amount of the said light flux, for the following reasons.

Figure 8:
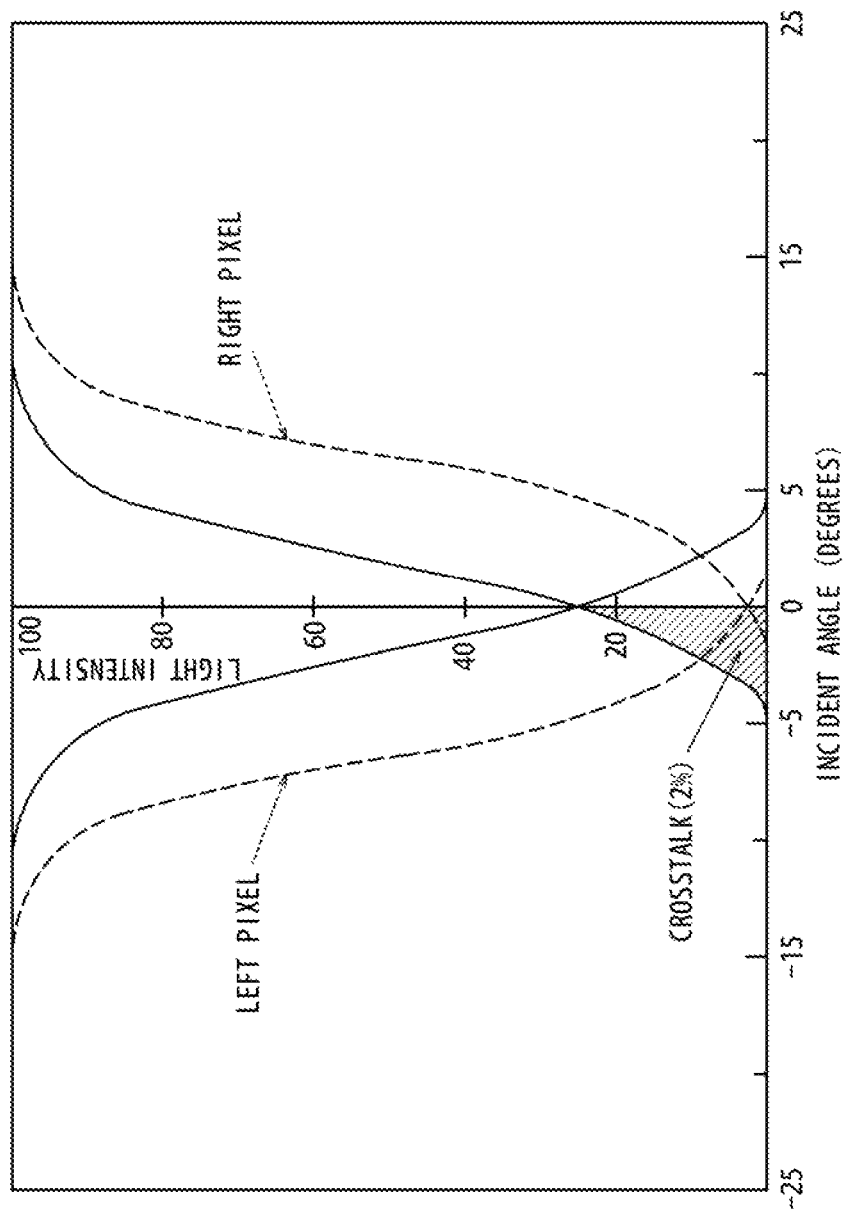
FIG. 8 is a graph for illustrating changes in light intensity at an optical axis when crosstalk occurs.

FIG. 8 is a graph for illustrating changes in light intensities at an optical axis when crosstalk occurs. The broken lines of FIG. 8 each represent the intensity of light received either by the right light receiving part 22R or by the left light receiving part 22L (that is, either the right pixel signal or the left pixel signal), relative to the incident angle of the subject light 100 obtained when the deviation is substantially 0. The light intensity is represented as a ratio relative to the maximum value of the intensity of the relevant light flux which is defined as 100%. When the deviation is 0, the right light flux and the left right flux both take a value close to 0 at around the incident angle of 0 degrees.

Meanwhile, the solid lines of FIG. 8 represent a case where the light receiving plane 34 is deviated from the focal point of the microlens 20. In this case, the hatched portion is indicative of crosstalk where the left light flux is received by the right light receiving element 22R. The inventors of the present invention carried out a simulation to find that even if the amount of crosstalk is as small as 2% of the total light amount of the light flux on one side, it could still lead to a light intensity of about as high as 20% to 30% at the incident angle of 0 degrees. Accordingly, when signals from the right light receiving part 22R and signals from the left light receiving part 22L are added to generate a two-dimensional image, even a signal to be obtained from light at the incident angle of 0 degrees can have an intensity of 40% to 60% relative to the intensities of other signals obtained at other incident angles. As long as the light intensity of this level can be obtained at the incident angle of 0 degrees, it can ensure to provide a natural image free of double lines which are otherwise generated when failing to obtain signals at around the incident angle of 0 degrees. Therefore, at least 2% of the light flux on either one of the right and left side may preferably be incident on the opposite one of the left and right receiving parts 22L, 22R.

On the other hand, smaller crosstalk is preferred in terms of ensuring the depth accuracy in a three-dimensional image. The depth accuracy is determined based on the parallax amount and the pixel pitch. Then, the parallax amount for obtaining a three-dimensional image information (depth information) by a pupil division system is defined as "a pupil diameter/2". Suppose that the amount of crosstalk is 10%, the pupil diameter decreases by 20%, which reduces the depth resolution by 20%.

For example, the pupil diameter is 10 mm when the focal length is 35 mm and F value is 3.5. With no crosstalk nor light quantity loss, the parallax amount may be calculated as 5 mm. Suppose that the image sensor 10 has a pitch of 5 μm, the depth resolution can be obtained as 620 mm at a position where the distance (object distance) of the optical system to the object is 5 m. In contrast thereto, when the light incident on either one of the light receiving parts 22L and 22R on the opposite side has crosstalk of 10% under the same condition, the pupil diameter decreases by 20%, which provides the parallax amount of 4 mm and the depth resolution of 745 mm. The resolution loss of 20% or more is not preferred, and thus the light flux on either one of the right and left side may preferably be incident on the opposite one of the left and right receiving parts 22L, 22R without exceeding 10% of the total light amount of the said light flux.

EXAMPLE

When the microlens 20 is defined to have a pitch of 10 μm, a focal length of 12.5 μm, a dead zone width of 0.2 μm, and a deviation of 1 μm, the following equation is established:

[Expression 5]

$$\left| \frac{z_d}{f_L} - \frac{S}{p} \right| = 0.08,$$

which satisfies the condition of the expression (9). Under the condition, parallax images for generating a three dimensional image can be detected at a proper depth resolution, while the signals from the left and right light receiving parts 22L, 22R may be added to obtain a two-dimensional image as a natural image.

As described above, according to the first embodiment, the pupil of the imaging lens 11 is disposed to be out of conjugation with the light receiving plane 34 of the light receiving parts 22L, 22R, to thereby allow parallax images for generating a three-dimensional image to be obtained, while the detection signals from the light receiving elements 22L, 22R may be added to create a two-dimensional image as a more natural image.

Further, when the condition represented by the expression (9) is satisfied, there can be generated a three-dimensional image where the depth resolution is ensured, while in displaying a two-dimensional image, the image can be displayed as a more natural image by including signals at around the incident angle of 0 degrees as well, with no double lines appearing thereon.

Second Embodiment

Figure 9:
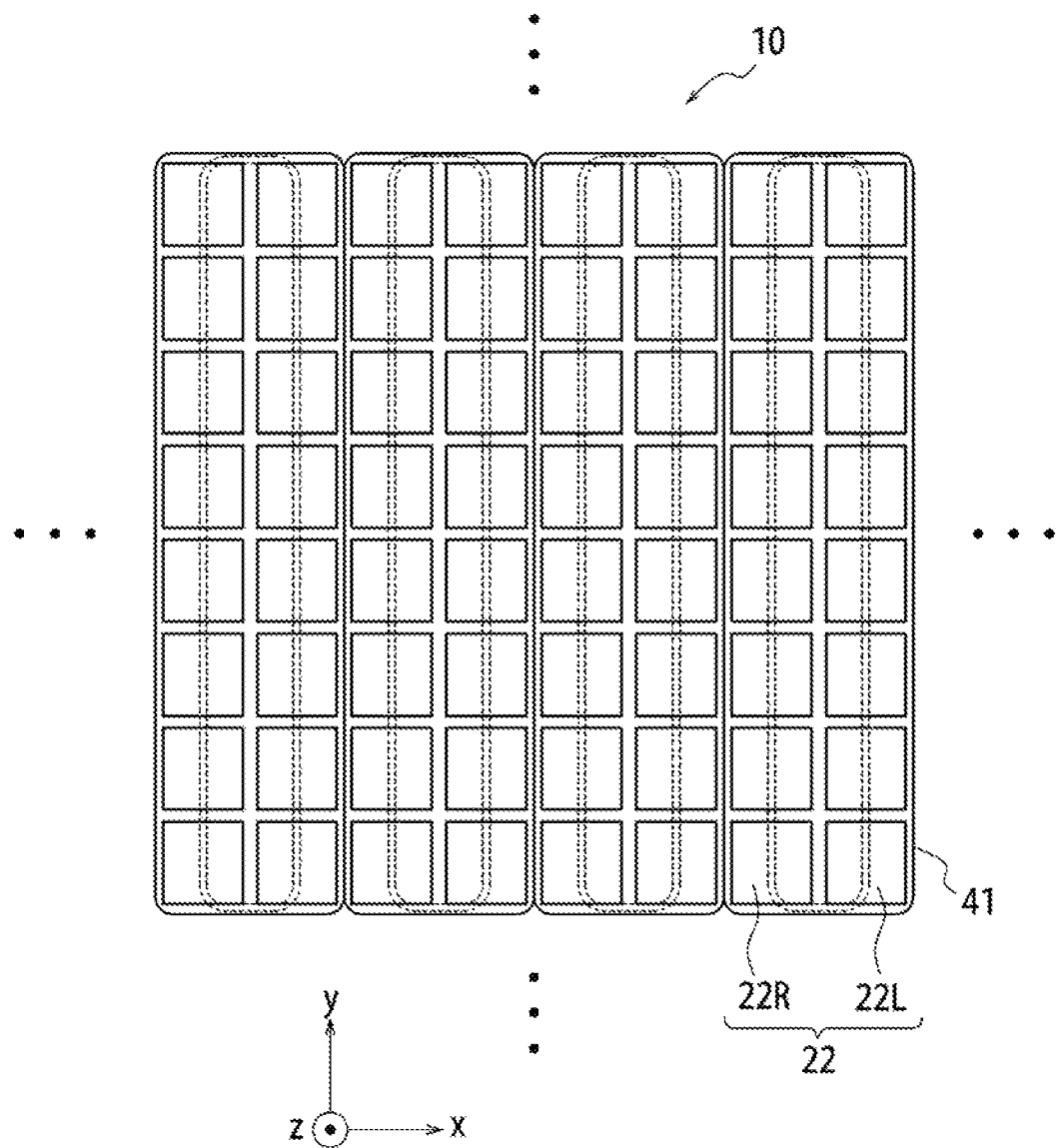
FIG. 9 is a plan view for illustrating a configuration of an image sensor according to a second embodiment of the present invention.
Figure 10:
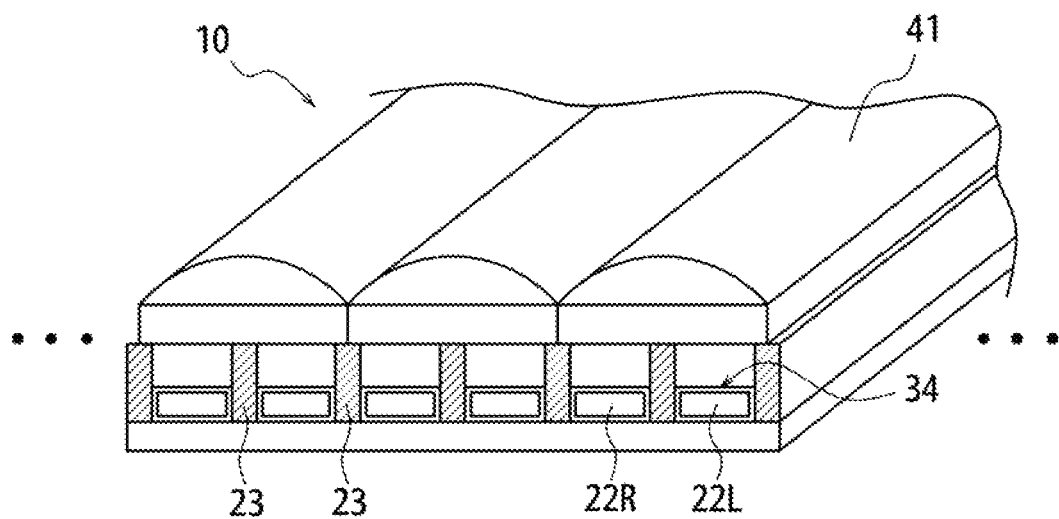
FIG. 10 is a perspective view for illustrating a configuration of the image sensor according to the second embodiment.

FIG. 9 is a plan view for illustrating a configuration of an image sensor according to a second embodiment of the present invention, and FIG. 10 is a perspective view for illustrating the configuration of the image sensor according to the second embodiment. According to the second embodiment, like in the first embodiment, the left and right light receiving parts 22L, 22R are alternately aligned side by side. The light receiving parts 22L, 22R have a wiring layer 23 disposed therebetween. Further, cylindrical lenses 41 having an optical axis in the Y-axis direction are arranged above (in the Z-axis direction of) the light receiving parts as being aligned side by side in the X-axis direction, and a pair of the left and right light receiving parts 22L, 22R is disposed below the same cylindrical lens 41. Further, a plurality of pairs of the light receiving parts 22, each of the pairs including one each of the left and right light receiving parts 22L, 22R, are disposed below each one cylindrical lens 41. The cylindrical lens 41 has a light-condensing effect only in the X-axis direction, and the light receiving plane 34 of the light receiving elements 22L, 22R and the pupil of the imaging lens 11 are disposed as being out of conjugation with each other. Since the rest of the configuration is similar to that of the first embodiment, the same or corresponding components are denoted by the same reference symbols and the description thereof is omitted.

According to the second embodiment, like in the first embodiment, the subject light 100 includes the left light flux passing through the left side of the pupil of the imaging lens 11 and the right light flux passing through the right side of the same, the left and right light fluxes being transmitted through the cylindrical lens 41 so that the right and left light fluxes are incident on the opposite one of the left light receiving part 22L and the right light receiving part 22R to be detected. Further, the light receiving plane 34 of the light receiving parts 22L, 22R are disposed as being deviated from a position conjugate to the pupil of the imaging lens, and thus, the left light flux and the right light flux are each partially incident on the right light receiving element 22R and on the left light receiving element 22L, respectively. This configuration allows for obtaining pixel signals for the left pixels and for the right pixels, the signals including parallax information for generating a three-dimensional image, and further, the pixel signals for the left pixel and the right pixel may be added to generate a two-dimensional image as a natural image with no double lines appearing thereon.

Third Embodiment

Figure 11:
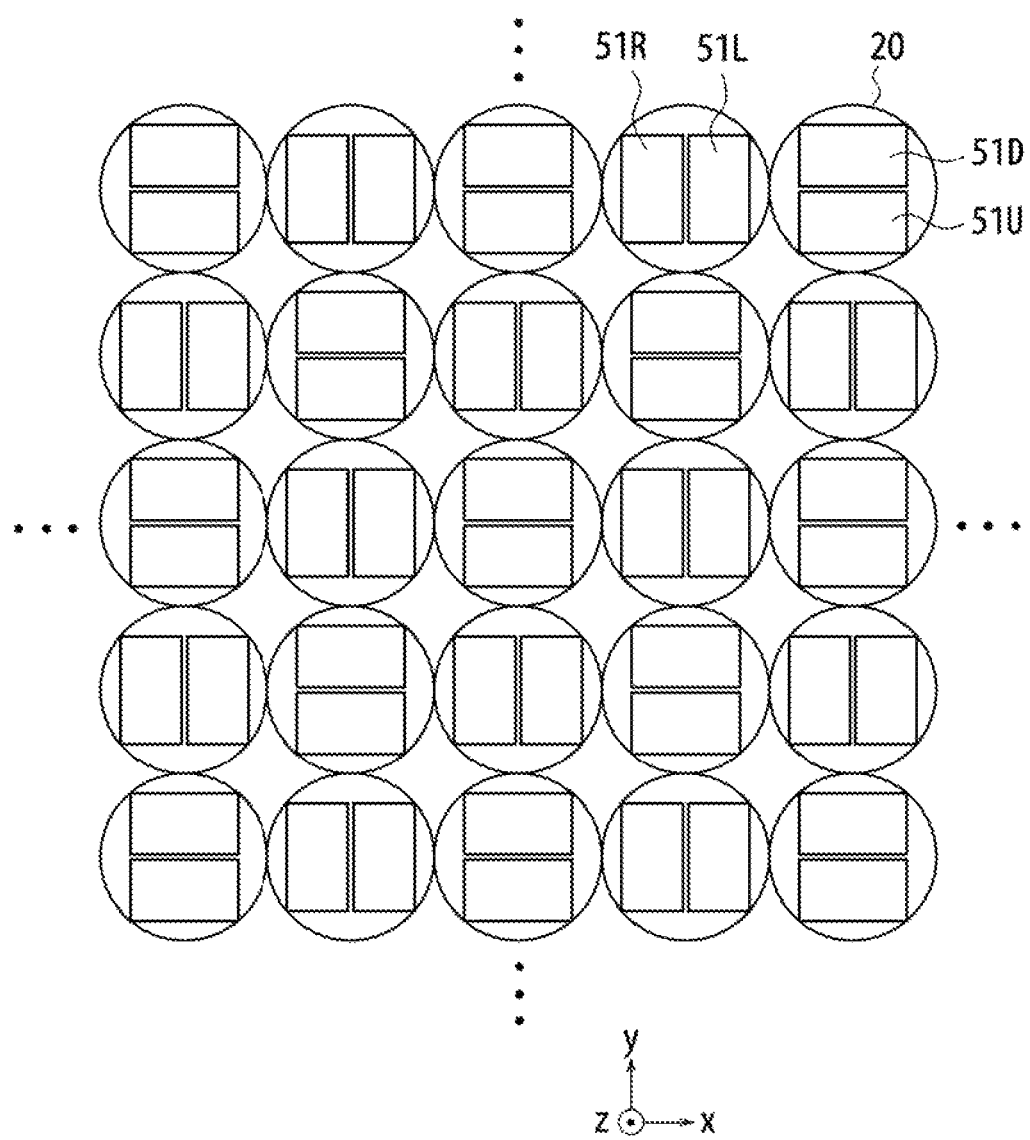
FIG. 11 is a plan view for illustrating a configuration of an image sensor according to a third embodiment of the present invention.

FIG. 11 is a plan view for illustrating a configuration of an image sensor according to a third embodiment of the present invention. According to the third embodiment, two each of the light receiving elements are disposed with respect to each one of the microlenses 20. The light receiving parts are available in two types: the one having a left light receiving part 51L and a right light receiving part 51R disposed in the horizontal direction relative to the imaging direction of the subject image; and the other one having an upper light receiving part 51U and a lower light receiving part 51D disposed in the perpendicular direction. The light receiving parts 51L, 51R, 51U, 51D have a light receiving plane 34 disposed at a position out of conjugation with the pupil of the imaging lens 11. Since the rest of the configuration is similar to that of the first embodiment, the same or corresponding components are denoted by the same reference symbols and the description thereof is omitted.

According to the third embodiment, the light receiving parts 51L, 51R disposed in the horizontal direction may be used to capture parallax images for use in generating a three-dimensional image, as in the first embodiment, while pixel signals from the left and right light receiving parts 51L, 51R may be added to create a two-dimensional image so as to obtain the image as a more natural image. Further, based on the signals from the light receiving parts 51U and 51D disposed in the perpendicular direction, depth information may also be obtained from parallax information in the perpendicular direction. In addition, signals from the light receiving parts 51U and 51D disposed in the perpendicular direction may also be added so as to be used, along with added signals from the light receiving parts 51L and 51R disposed in the horizontal direction, to create a two-dimensional image.

Fourth Embodiment

Figure 12:
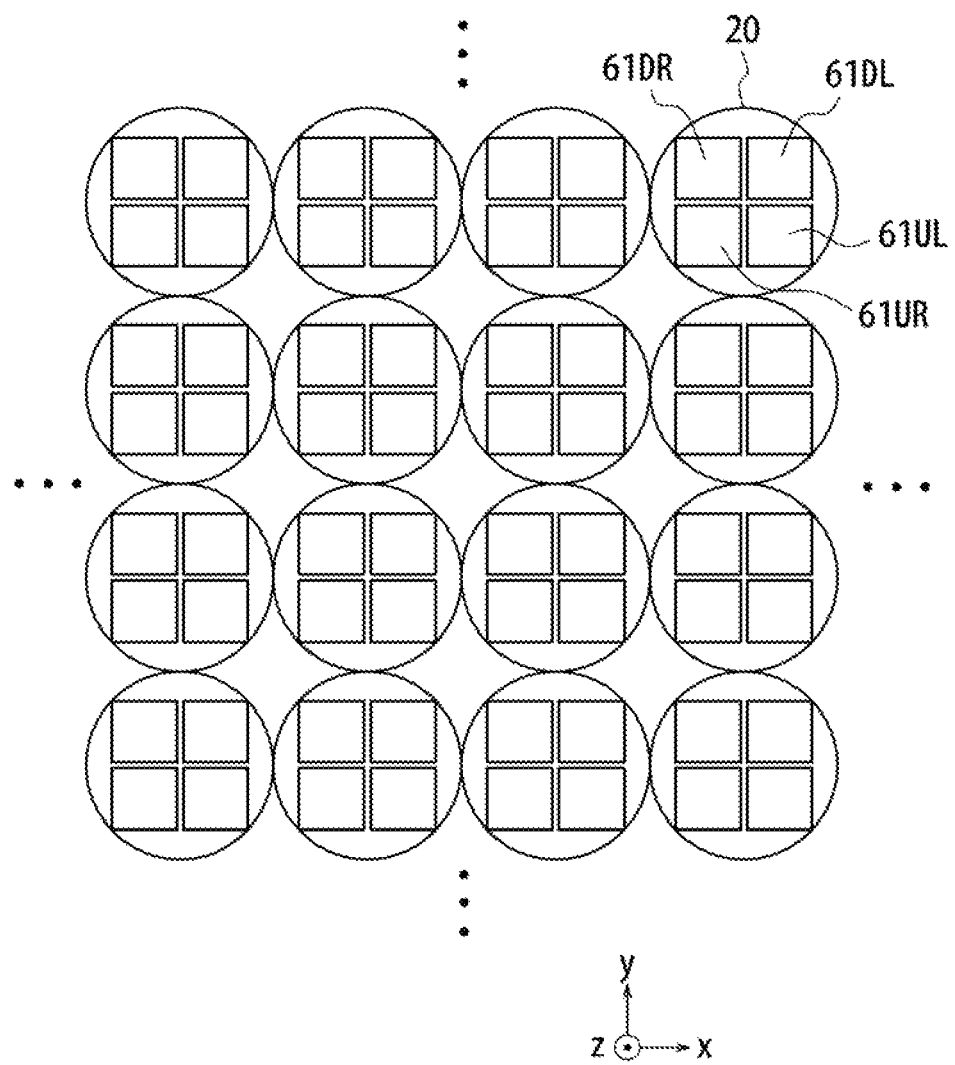
FIG. 12 is a view for illustrating a configuration of an image sensor according to a fourth embodiment of the present invention.

FIG. 12 is a view for illustrating a configuration of an image sensor 10 according to a fourth embodiment of the present invention. According to the fourth embodiment, with respect to each one of the microlenses 20, each four light receiving parts 61DL, 61DR, 61UL, 61UR in total including two rows each in the horizontal direction and in the perpendicular direction, respectively, are disposed. Here, the light receiving parts 61DL, 61DR, 61UL, 61UR each correspond to four sections on the lower left side, lower right side, upper left side, and upper right side, respectively, of the pupil of the imaging lens 11, the sections being obtained by dividing into four the pupil by horizontal and perpendicular straight lines. The light receiving parts 61DL, 61DR, 61UL, 61UR have a light receiving plane 34 disposed at a position out of conjugation with the pupil of the imaging lens 11. Since the rest of the configuration is similar to that of the first embodiment, the same or corresponding components are denoted by the same reference symbols and the description thereof is omitted.

According to the fourth embodiment, a three-dimensional image can be generated as in the first embodiment, based on pixel signals output from the right-and-left pixel pair of the image sensor 10, that is, the light receiving parts 61DL and 61DR and/or the light receiving parts 61UL and 61UR, and further the signals from the light receiving parts 61DL, 61DR, 61UL, and 61UR associated with one microlens 20 may be added to serve as pixel signals for a two-dimensional image, to thereby generate a two-dimensional image. Such configuration provides a similar effect as in the first embodiment. In addition, based on pixel signals output from the upper-and-lower pixel pair of the image sensor 10, namely, the light receiving parts 61DL and 61UL and/or the light receiving parts 61DR and 61UR, parallax information in the perpendicular direction may also be obtained. Therefore, parallax information both in the perpendicular direction and in the horizontal direction can be obtained using the same image sensor.

It should be noted that the present invention is not limited only to the aforementioned embodiments, and may be subjected to various modifications and alterations. For example, the number of light receiving parts associated with one microlens is not limited to two or four. Further, the light receiving elements may be aligned in any direction, without being limited to the lateral and perpendicular directions. For example, the image sensor may include light receiving element pairs which are aligned diagonally. The display may not necessarily be formed integrally with the imaging apparatus, and may be configured as an independently-provided piece of hardware in order for displaying a three-dimensional image.

REFERENCE SIGNS LIST 1 imaging apparatus
2 microlens array
10 image sensor
11 imaging lens
12 image processor
14 controller
16 memory
18 display
19 bus
20 microlens
22 light receiving element pair
22L, 22R light receiving part
23 wiring layer
30 optical axis
32 aperture
34 light receiving plane
36 pupil conjugate plane
41 cylindrical lens
51L, 51R, 51U, 51D light receiving part
61DL, 61DR, 61UL, 61UR light receiving part
100 subject light

The invention claimed is:

1. An imaging apparatus, comprising:
a microlens array having a plurality of microlenses regularly aligned two-dimensionally, on which light from a subject condensed by an imaging lens is incident; and
a plurality of light receiving parts disposed for each of the plurality of microlenses, the plurality of light receiving parts being associated with each microlens, the plurality of light receiving parts including at least two light receiving parts for receiving the light from the subject that has been imaged onto the microlenses and subjecting the light to photoelectric conversion,
wherein the imaging apparatus has a first gap between a plurality of the light receiving parts associated with one of the microlenses, and a second gap between the light receiving part associated with the one of the microlenses and the light receiving part associated with another one of the microlenses, the second gap being larger than the first gap, and
wherein the imaging lens has a pupil disposed as being out of conjugation with a light receiving plane of each of the light receiving parts.

2. The imaging apparatus according to claim 1, wherein the second gap has a wiring layer disposed therein, the wiring layer being for driving a plurality of the light receiving parts.

3. The imaging apparatus according to claim 2, wherein the wiring layer is stood around a plurality of the light receiving parts associated with the microlens and extends from a plane having the light receiving parts disposed thereon toward a plane having the microlenses disposed thereon.

4. The imaging apparatus according to claim 1, comprising:
an image sensor for outputting a pixel signal, the image sensor comprising: the microlens array; and a plurality of the light receiving parts disposed by at least two each in each of the microlenses;
an image processor for generating captured image data, from the pixel signal;
a memory for storing the captured image data; and
a controller for controlling the operations of the image sensor, the image processor, and the memory.

5. The imaging apparatus according to claim 1, wherein the first gap has a dead zone disposed therein.

6. The imaging apparatus according to claim 5, wherein the following relation is established:

$$0.02 < \left| \frac{Z_d}{f_L} - \frac{S}{p} \right| < 0.1, (Z_d \neq 0),$$

where $f_L$ represents the focal length of the microlens, p represents the pitch of the microlenses, S represents the width of the dead zone, and $Z_d$ represents a deviation between the light receiving plane of the light receiving parts and the conjugated position of the pupil of the imaging lens.

7. The imaging apparatus according to claim 1, wherein the light receiving parts are disposed, for each of the microlenses, by two each in the horizontal direction of an image of the subject.

8. The imaging apparatus according to claim 1, wherein the microlens is a cylindrical lens.

9. The imaging apparatus according to claim 1, wherein the plurality of light receiving parts associated with each of the microlenses include: each two light receiving parts disposed in the horizontal direction of the image of the subject; and each two light receiving parts disposed in the perpendicular direction of the image of the subject.

10. The imaging apparatus according to claim 1, wherein the light receiving parts are disposed by two rows each in the horizontal direction and in the perpendicular direction, respectively, of the image of the subject, as being associated with each of the microlenses.

11. The imaging apparatus according to claim 9, wherein the imaging apparatus generates, based on pixel signals obtained from the plurality of light receiving parts each disposed in the horizontal direction and perpendicular direction, parallax images in the horizontal direction and in the perpendicular direction, respectively, and generates a three-dimensional image, based on the parallax images.

12. The imaging apparatus according to claim 10, wherein the imaging apparatus generates, based on pixel signals obtained from the plurality of light receiving parts each disposed in the horizontal direction and perpendicular direction, parallax images in the horizontal direction and in the perpendicular direction, respectively, and generates a three-dimensional image, based on the parallax images.

13. The imaging apparatus according to claim 1, wherein the imaging apparatus generates at least one of: a plurality of parallax images having parallax to one another, based on pixel signals obtained from the plurality of light receiving parts; and a two-dimensional image obtained by adding relevant pixel signals obtained from the plurality of light receiving parts.

* * * * *